(12) United States Patent
Kaase et al.

(10) Patent No.: US 10,481,198 B2
(45) Date of Patent: Nov. 19, 2019

(54) STATIONARY BATH FOR TESTING ELECTRONIC COMPONENTS

(71) Applicant: TEXAS INSTRUMENTS INCORPORATED, Dallas, TX (US)

(72) Inventors: David Wayne Kaase, Grapevine, TX (US); Joseph Milton Yehle, Dallas, TX (US); James Henry McGee, Jr., Rowlett, TX (US); Clemon Howell, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 120 days.

(21) Appl. No.: 15/874,677

(22) Filed: Jan. 18, 2018

(65) Prior Publication Data

US 2019/0204377 A1    Jul. 4, 2019

Related U.S. Application Data

(60) Provisional application No. 62/611,204, filed on Dec. 28, 2017.

(51) Int. Cl.
*G01R 31/28* (2006.01)
*G01R 31/12* (2006.01)

(52) U.S. Cl.
CPC ....... *G01R 31/2817* (2013.01); *G01R 31/129* (2013.01); *G01R 31/1281* (2013.01); *G01R 31/2856* (2013.01); *G01R 31/2863* (2013.01)

(58) Field of Classification Search
CPC ............ G01R 31/2817; G01R 31/2856; G01R 31/129; G01R 31/1281; G01R 31/2863
USPC .................. 324/750.08, 750.03, 750.01, 537
See application file for complete search history.

(56) References Cited

U.S. PATENT DOCUMENTS

| 8,613,293 | B2 * | 12/2013 | Bolgar ................ F16K 11/0743 137/597 |
| 2002/0188237 | A1 * | 12/2002 | Ferber .................. A61H 33/025 601/168 |
| 2008/0066225 | A1 * | 3/2008 | Feener ................... A47K 3/127 4/572.1 |

* cited by examiner

*Primary Examiner* — Giovanni Astacio-Oquendo
(74) *Attorney, Agent, or Firm* — Jacqueline J. Garner; Charles A. Brill; Frank D. Cimino

(57) ABSTRACT

A system and method for stress-testing of electronic components are disclosed. The system and method include a stationary bath including a tub that defines an aperture in a plane, in which a plurality of slots are positionable and defined inside the tub and oriented orthogonally with respect to the plane. A dielectric fluid in the tub is heated by a heating element to a predetermined temperature value. A board is configured to be retrievably placed with one of the plurality of slots, the board having a plurality of sockets operable to receive corresponding electronic components.

20 Claims, 6 Drawing Sheets

STATIONARY BATH FOR TESTING ELECTRONIC COMPONENTS

CROSS-REFERENCE TO RELATED APPLICATIONS

The present application claims priority to U.S. Provisional Patent Application No. 62/611,204, which was filed Dec. 28, 2017, is titled "Stationary Bath For Testing Electronic Components," and is hereby incorporated herein by reference in its entirety.

BACKGROUND

The present subject matter relates generally to stress testing of electronic components. Generally, stress testing of electronic components is undertaken to meet industry specifications, customer requirements, etc.

SUMMARY

In accordance with at least one embodiment, disclosed is a system comprising a stationary bath including a tub that defines an aperture in a plane, in which a plurality of slots are positionable and defined inside the tub and oriented orthogonally with respect to the plane. A dielectric fluid in the tub is heated by a heating element to a predetermined temperature value. A board is configured to be retrievably placed with one of the plurality of slots, the board having a plurality of sockets operable to receive corresponding electronic components.

In accordance with at least another embodiment, disclosed a method comprising the obtaining of a stationary bath with a plurality of slots positioned inside a tub of the stationary bath, the tub having a dielectric fluid, heating the dielectric fluid to one of a plurality of predetermined temperature values. A board is provided having a plurality of conductive leads and a plurality of sockets, in which a plurality of electronic components are positioned onto respective ones of the plurality of sockets. The board is retrievably placed with one of the plurality of slots, and a power source is coupled to the plurality of conductive leads. Following a predetermined period of time, the power source is decoupled from the plurality of conductive leads, and the board retrieved from the one of the plurality of slots. A determination is made as to whether one or more of the plurality of electronic components has failed. When the one or more of the plurality of electronic components have failed, the one or more failed plurality of electronic components are removed from the board; and the board is retrievably replaced into the dielectric fluid.

BRIEF DESCRIPTION OF THE DRAWINGS

For a detailed description of various examples, reference will now be made to the accompanying drawings in which.

DETAILED DESCRIPTION

Figure 1A:
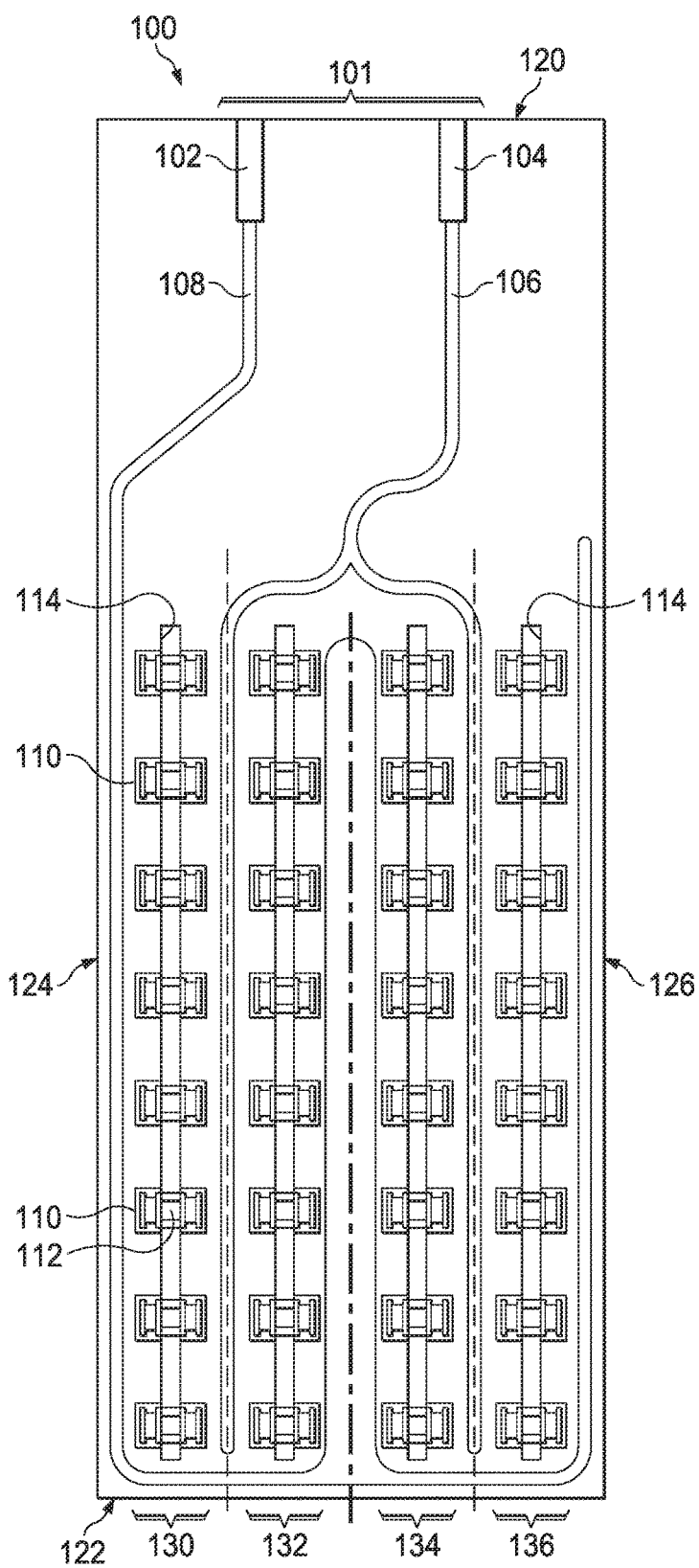
FIG. 1A shows a board for stress testing of electronic components in accordance with various examples.

Generally, stress tests can include high voltage isolation Time Dependent Dielectric Breakdown (TDDB) testing that uses high temperature bath techniques for predetermined lengths of time, while coupled to a constant voltage power source (CVS). As an example, stress testing operates to determine the resiliency, in extreme environments, of an electronic component to the formation of a conducting path through a dielectric of an electronic component due to electron tunneling current.

Because air alone has an undesirable dielectric property to prevent and/or mitigate arc-over conditions for components-under-test in excessive heat and/or high voltage conditions, a dielectric oil is used to mitigate arc-over conditions and false-fail rates. Also, dielectric oil heating can be more readily regulated over time, and sustained at a predetermined temperature value as compared with air. The predetermined temperature value depends on the stress test specifications and/or customer specification. Examples of predetermined temperature values may be at 25-degrees C., 150-degrees C., and values in between, which are then applied to the dielectric oil while a high voltage source is applied to the electronic component(s).

Examples of stress testing devices and methods have included tempered glassware containers containing dielectric oil in which a board with sockets having integrated circuit devices is submerged for a period of time. In use, the tempered glassware container and its contents have been placed inside a high-temperature air oven to heat the oil to a predetermined temperature value. At intervals, the tempered glassware and contents would be removed, by hand, to a testing bench for determining which of the electronic components have failed, and removed for further testing or post-test study for production runs. During the oven extraction and transport, however, hot fluid may spill from the tempered glassware requiring re-filling of the dielectric fluid, as well as the fluid and the container beginning to lose heat, each of which can delay additional testing by requiring time to bring the dielectric fluid back to the predetermined temperature value for stress testing. Further, the number of components that may be concurrently tested has been generally limited to the restrictive size of tempered glass containers. Thus, it is desirable to identify a more ergonomic device for conducting high voltage stress testing, at high temperatures, capable of long stress durations while electronic components are submerged in a dielectric fluid.

The systems and methods described herein relate to eliminating the need to manually handle and/or transport tempered glass containers of heated dielectric fluid and boards, along with a faster isolation of component failures and an increased capacity for the amount of components that may be stress tested for a given device footprint and/or real-estate.

For stress testing, a board is retrievably placed in one of a plurality of slots that are formed within a tub of a stationary bath. The plurality of slots can be defined in the tub of the stationary bath, or as another example, a rack may define the plurality of slots to receive the board and/or boards. The rack may then include a plurality of boards, and be retrievably placed within the tub. For promoting fluid circulation and minimizing the presence of air bubbles, each of the plurality of slots define a hole therethrough, such that each of the plurality of sockets is positioned over the at least one trench.

The system and methods described herein promote faster failure isolation and improve testing safety. Also, as the board is disengaged from the high voltage source and cools after being removed from the heated dielectric fluid, whether the electronic component failed can be determined by a continuity test device (such as an ohmmeter). Also, because the dielectric fluid is sustained at a predetermined temperature value(s) by the stationary bath, additional stress testing for additional electronic components can resume more quickly. Generally, the system and methods described also realize improvements in testing accuracy because of lower false failures of the devices, in the stress testing turnover rate due to the larger number of electronic components that are placed on the board, and in the number of boards that can be received for testing at a time.

Generally, a stress test operates to provide a quality metric relating to an electronic component. As an example, a stress test (e.g., a destructive test) generates power and/or temperature data indicative of a failure rate metric for an electronic component process run and/or a production process. Data pertaining to the power and/or temperature at which an electronic component fails may be obtained using the testing techniques disclosed herein. Such data may be assessed against a failure criteria level (for example, as set out under MIL-STD specifications, UL-STD specifications, customer-based specifications, etc.). Feedback based on the resulting stress test data and/or failure rate metric can be used to improve manufacturing processes and/or controls to attain and/or exceed a desired failure criteria level.

FIG. 1A shows a board 100 for stress testing of electronic components. The board 100 includes a plurality of sockets 110 that are operable to receive electronic components.

The board 100 has a first end 120, a second end 122, and a third end 124, and a fourth end 126. The first and second ends 120 and 122 are parallel to each other, and the third and fourth ends 124 and 126 are parallel to each other. In this respect, the board 100 generally has a rectangular profile, which may include a square profile, a rhombus profile, etc., as desired to provide the system and device as described herein. Also, the board 100 may have notches, keys, tabs, etc., that facilitate use of the board 100 for stress testing of electronic components. Also, various materials may be used to form the board 100, as well as various forms of boards, such as a single-sided structure with conductive runs and/or ground planes on one side, a double-sided structure with conductive runs on each side of a substrate layer, a multi-layer structure with outer and inner layers of runs alternating with substrate layers, etc.

The first end 120 of the board 100 includes a plurality of conductive leads 101. In the example embodiment, the board 100 includes conductive leads 102 and 104. The conductive lead 102 couples with a ground and/or return terminal of a constant high-voltage source, and conductive lead 104 couples with a source terminal of the constant high-voltage source. The plurality of conductive leads 101 may include additional conductive leads to accommodate the stress testing of different electronic components with different constant source voltages. For example, a two-conductor lead structure can provide a singular constant source voltage to stress test a two-pin electronic component, a three-conductor lead structure can provide a dual-constant source voltage to stress test a three-pin electronic component, a four-conductor lead structure can be used to provide a three-constant voltage source to stress test a four-pin electronic component testing, etc.

The conductive lead 102 is coupled to a ground rail 108, and the conductive lead 104 is coupled to a power supply rail 106. The routing of the power supply rail 106 and the ground rail 108 are based upon the column configuration of the sockets 110.

The plurality of sockets 110 are arranged in at least four columns 130, 132, 134 and 136 on the board 100. The continuous power supply rail 106 is positioned between first socket column 130 and the second socket column 132, and between the third socket column 134 and the fourth socket column 136. The continuous power supply rail 106 is not positioned between the second and third socket columns 132 and 134, respectively.

The ground rail 108 is positioned between the first socket column 130 and the third end 124 of the board 100, between the fourth socket column 136 and the fourth end 126 of the board 100, and between the second socket column 132 and the third socket column 134. In this configuration, the plurality of sockets for each socket column 130, 132, 134 and 136 are serviceable by the continuous power supply rail 106 and the ground rail 108 to provide a continuous voltage supply for stress testing.

Figure 1B:
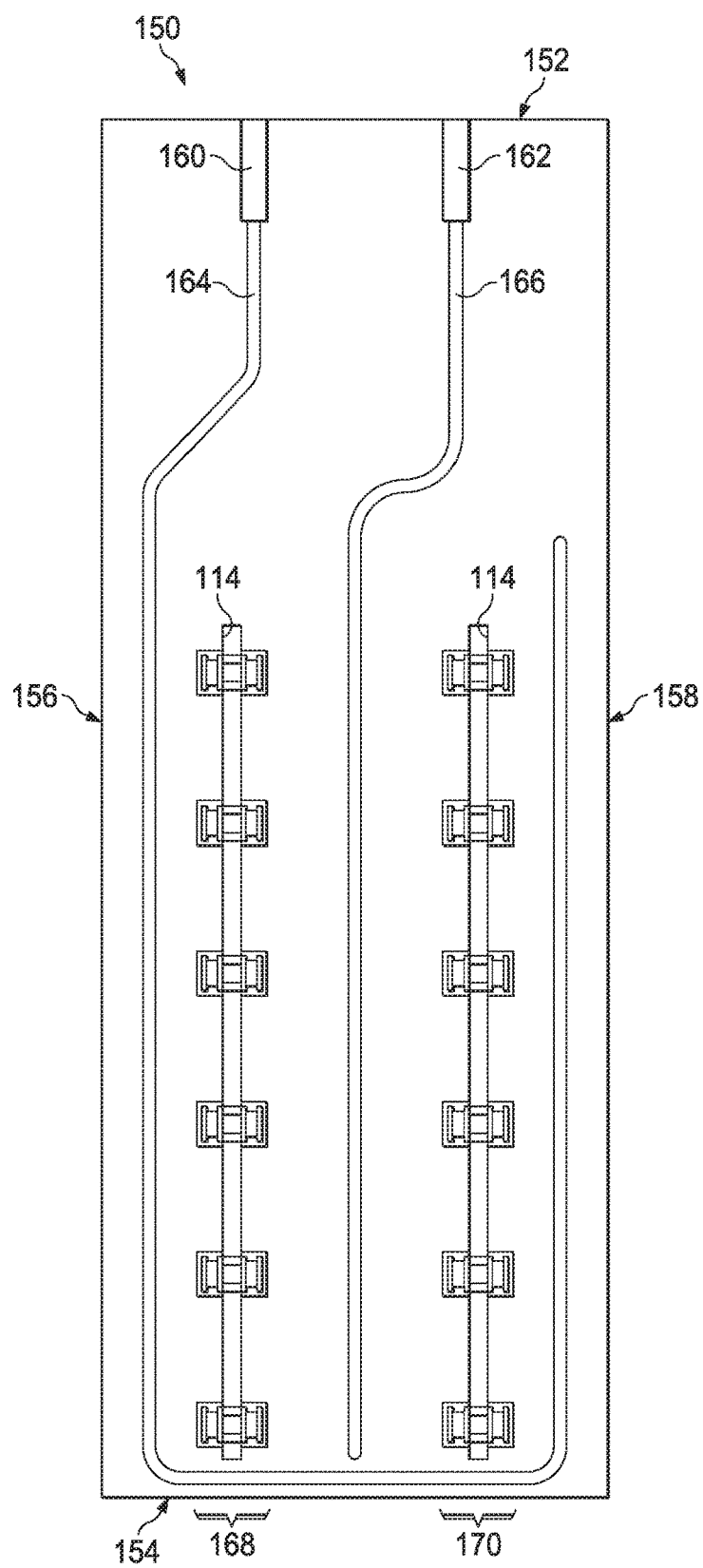
FIG. 1B shows another board for stress testing of electronic components in accordance with various examples.

In another example, a two-column configuration of sockets can be implemented, as depicted in FIG. 1B. FIG. 1B shows a board 150 having a first end 152, a second end 154, a third end 156, and a fourth end 158. The board 150 additionally includes a first socket column 168 and a second socket column 170. Positioned along the first end 152 are leads 160 and 162. A ground supply rail 164 couples to lead 160, and a voltage supply rail 166 couples to lead 162. The ground supply rail 164 is positioned between the third end 156 and the socket column 168, as well as between the socket column 170 and the fourth end 158. In addition, the voltage supply rail 166 is positioned between the columns 168 and 170, as shown. In this configuration, the plurality of sockets of each socket column 168 and 170 are serviceable by the supply rail 166 and the ground rail 164 to provide a continuous voltage supply for stress testing.

The number of sockets 110 for each of the socket column 130, 132, 134 and 136, and each of the socket column 168 and 170, may be different than depicted in FIGS. 1A and 1B. In addition, the number of sockets 110 serviceable by the board 100 may vary based on the particular physical and electrical requirements of electronic components to undergo stress testing, as well as other size and/or area considerations to accommodate such electronic components.

Referring again to FIG. 1A, for promoting fluid circulation and minimizing air bubbles to mitigate arc-over conditions, each of the plurality of sockets 110 defines a hole 112 therethrough, and the board 100 defines at least one trench 114 therethrough, such that each of the plurality of sockets 110 is positionable over the at least one trench 114. The at least one trench 114 also operates to further isolate a power terminal from a ground terminal of a socket 110. The plurality of sockets 110 may include socket types for accommodating testing of various-sized chip-scale packaging.

Figure 2:
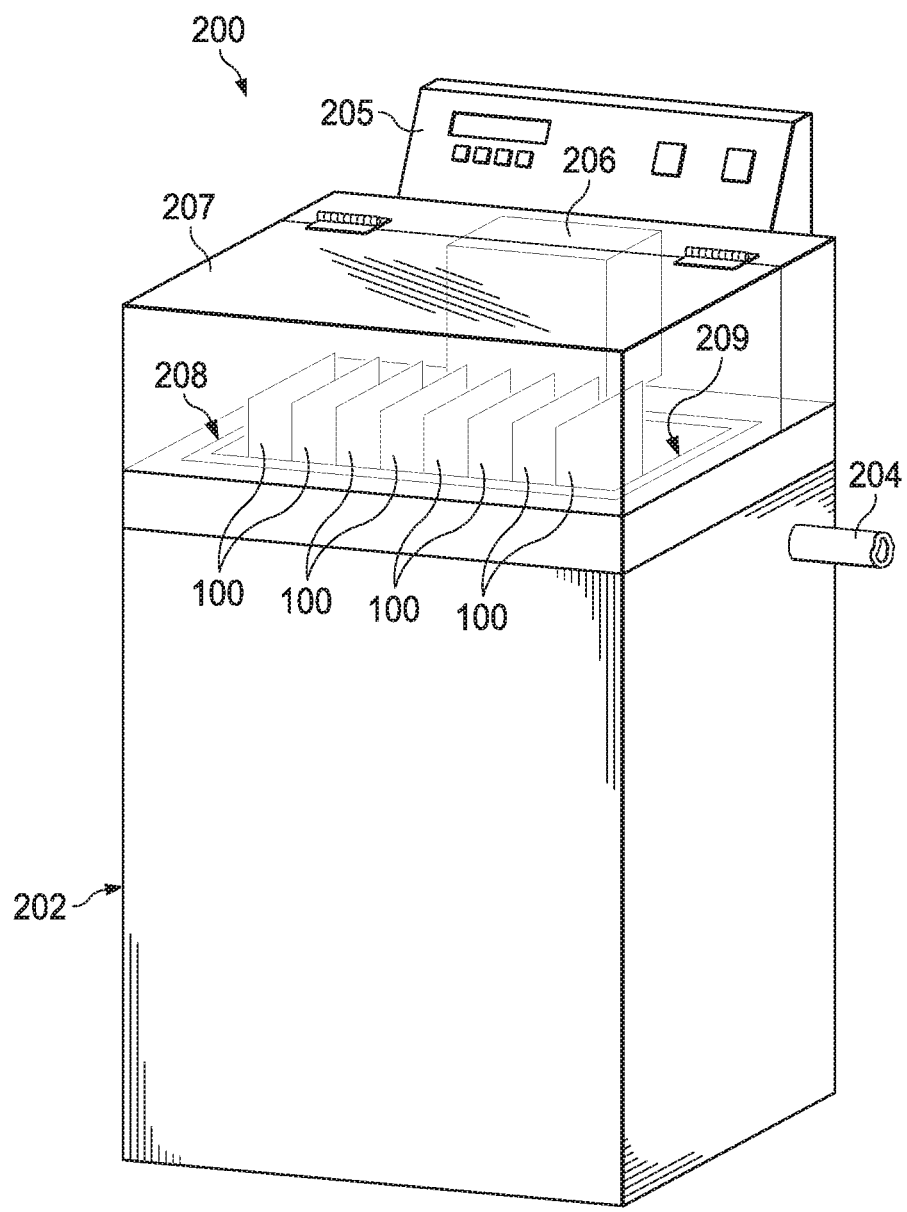
FIG. 2 illustrates a perspective view of a stationary bath in accordance with various examples.

FIG. 2 illustrates a perspective view of a stationary bath 200. The stationary bath 200 includes body 202, overflow 204, tub 208, control panel 205, and stirrer 206. Boards 100, such as those in FIGS. 1A and 1B, are retrievably placed inside the tub 208.

The term "stationary bath" is in contradistinction to stress-testing devices that required the assembly of the container, the dielectric fluid, the boards, and electronic components-under-test and that subsequently required the entirety of the assembly to be handled and/or transported as a combined unit in a non-stationary manner. The embodiments described in detail herein with reference to FIGS. 1-5 instead illustrate the bath 200 as an in place, or stationary, stress test system in which board(s) 100 are retrievably placed.

The body 202 defines the tub 208, which defines an aperture 209 in a plane. The boards 100, as well as the slots in which they are positioned (described below), are orthogonal to this plane. The body 202 includes the overflow 204 in the event that a dielectric fluid in the tub 208 expands or exceeds the level of the overflow 204, in which case a controlled capture of the dielectric fluid occurs.

A timer device operates to record a cumulative stress time for the boards 100, and to record a total time that a high voltage source is applied, or stresses, components being tested via the board(s) 100. Such a time device can be an analog time, a digital timer that can be a stand-alone device that can receive and transmit digital data relating to the parameters being monitored for the stress testing of an electronic device. Also, the timer device can function to monitor power levels of a high voltage source, such that upon an electronic device failure, a notification may be issued to a test operator to indicate when an electronic component failure condition occurs. For example, when an electronic device fails, an electric current limit is reached, and the high voltage source output is stopped. The time device can issue an alert (such as an audible alert, a visual alert, etc.) to alert a test operator of the electronic device failure. In this respect, high voltage testing may be suspended so that the board(s) 100 can be removed to conduct further component failure testing. To promote uniformity for the dielectric fluid temperature, and to mitigate air bubble formation, the stirrer 206 operates to circulate the dielectric fluid in the tub 208.

As an example of a further embodiment, the stationary bath 200 can include an enclosure 207 to retain heat within the tub 208 and to contain vapors, if present, within the tub 208 when in a closed position. A high voltage lead can electrically couple with the board(s) 100 for high voltage testing through the enclosure. Also, a high voltage source can be powered and engaged with the board(s) 100 upon closure of an enclosure, or the high voltage source can be powered down upon opening the enclosure, as is discussed in detail with reference to FIGS. 3-5.

Figure 3:
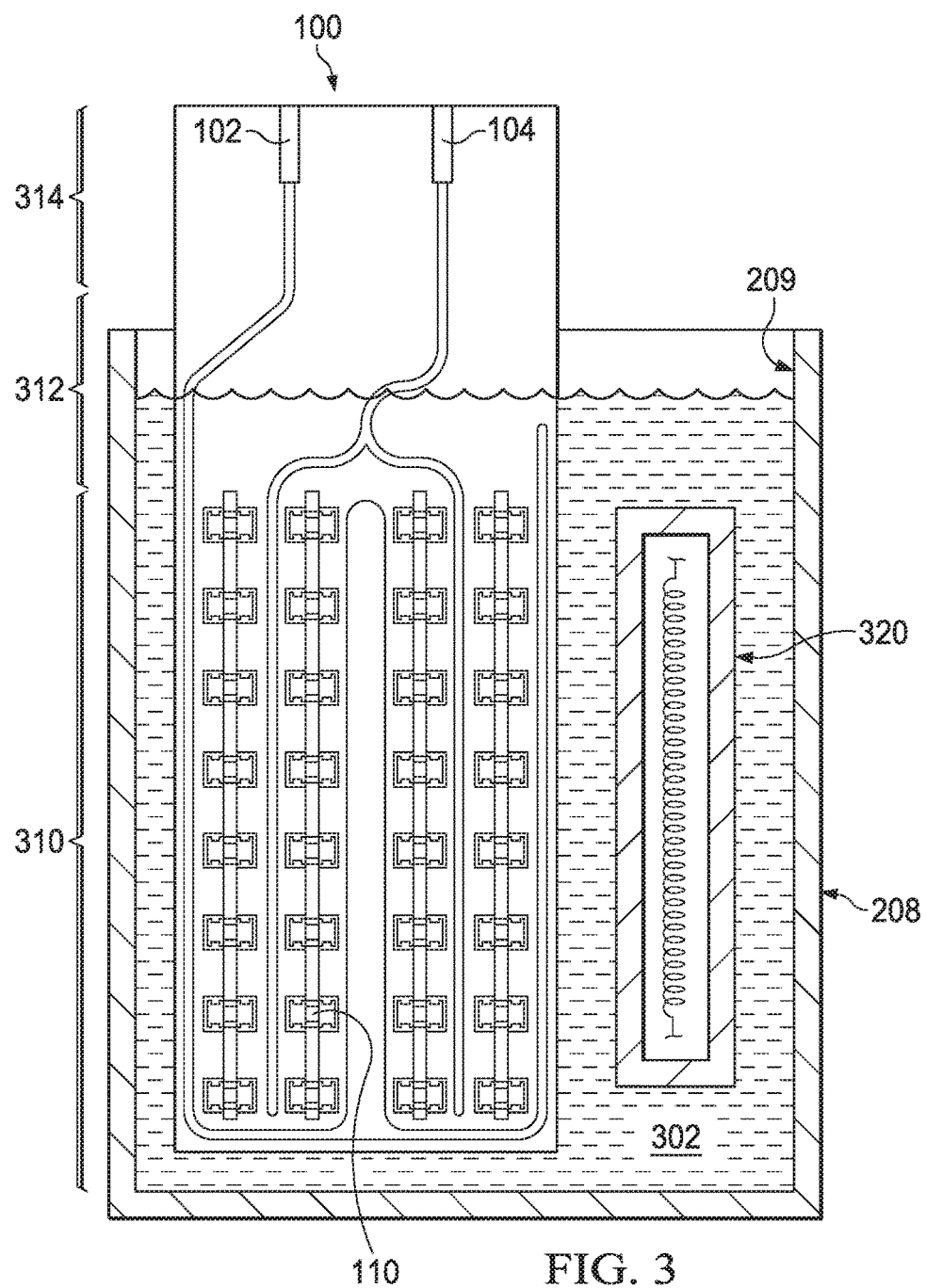
FIG. 3 illustrates a cross-sectional view of the tub for the stationary bath of FIG. 2, having a board retrievably placed in the tub in accordance with various examples.

FIG. 3 illustrates a cross-sectional view of the tub 208 for the stationary bath 200 of FIG. 2, with a board 100 retrievably placed in the tub 208 through the aperture 209. The tub 208 includes dielectric fluid 302 and heating element 320 for stress-testing of electronic components received by the plurality of sockets 110 (FIG. 1A).

Through the heating element 320, the dielectric fluid 302 is brought to a predetermined temperature value, such as 25-degrees C. to 150-degrees C. The dielectric fluid 302 includes at least one of a vegetable-based oil, a silicon-based oil, or a synthetic oil accommodating electronic components that can be stress-tested with such fluids. An example of a heating element 320 is a resistive component that produces resistive heat in the presence of an electric power source.

An example of a synthetic-based oil includes Galden® High Temperature (HT) fluid, which can be used at a lower temperature value (such as 25-degrees C.) to high temperature values (such as 150-degrees C.). Galden® HT fluid generally has favorable viscosity characteristics at room temperature, which functions to reduce trapped air-bubble formations on the board 100, and related undesirable arc-over conditions. That is, trapped air-bubbles can cause an arc-over condition, as well as non-uniform distribution of the dielectric fluid 302, which in turn results in a false-failure for an electronic component. Also, different grades of Galden® HT dielectric fluid provide different boiling points, as well as other physical parameters. For example, HT200 has a boiling point of 200-degrees C., HT230 has a boiling point of 230-degrees C., HT270 has a boiling point of 270-degrees C., etc.

The board 100 includes zones 310, 312, and 314 that correspond to the interrelation with the dielectric fluid 302 when retrievably placed in the tub 208. As the board 100 is retrievably placed in the tub, the plurality of sockets 110 (FIG. 1A) are submerged in the dielectric fluid 302, which has been heated to a predetermined temperature value.

When retrievably placed in the dielectric fluid 302, the wet zone 310 includes the portion of the board 100 with the plurality of sockets 110. The dry zone 314 corresponds to a portion of the board in which the first end 120 (FIG. 1A) is not in contact with the dielectric fluid 302. That is, the plurality of conductive leads, such as ground conductive lead 102 and power conductive lead 104, are not in contact with the dielectric fluid 302.

The mixed (wet/dry) zone 312 of the board 100 is defined to allow for expansion of the dielectric fluid 302 during heating from room temperature, and also for evaporation and/or vaporization of the oil, if any. In effect, the mixed zone 312 provides a buffer for immersion of the plurality of sockets 110 in the dielectric fluid 302.

Figure 4:
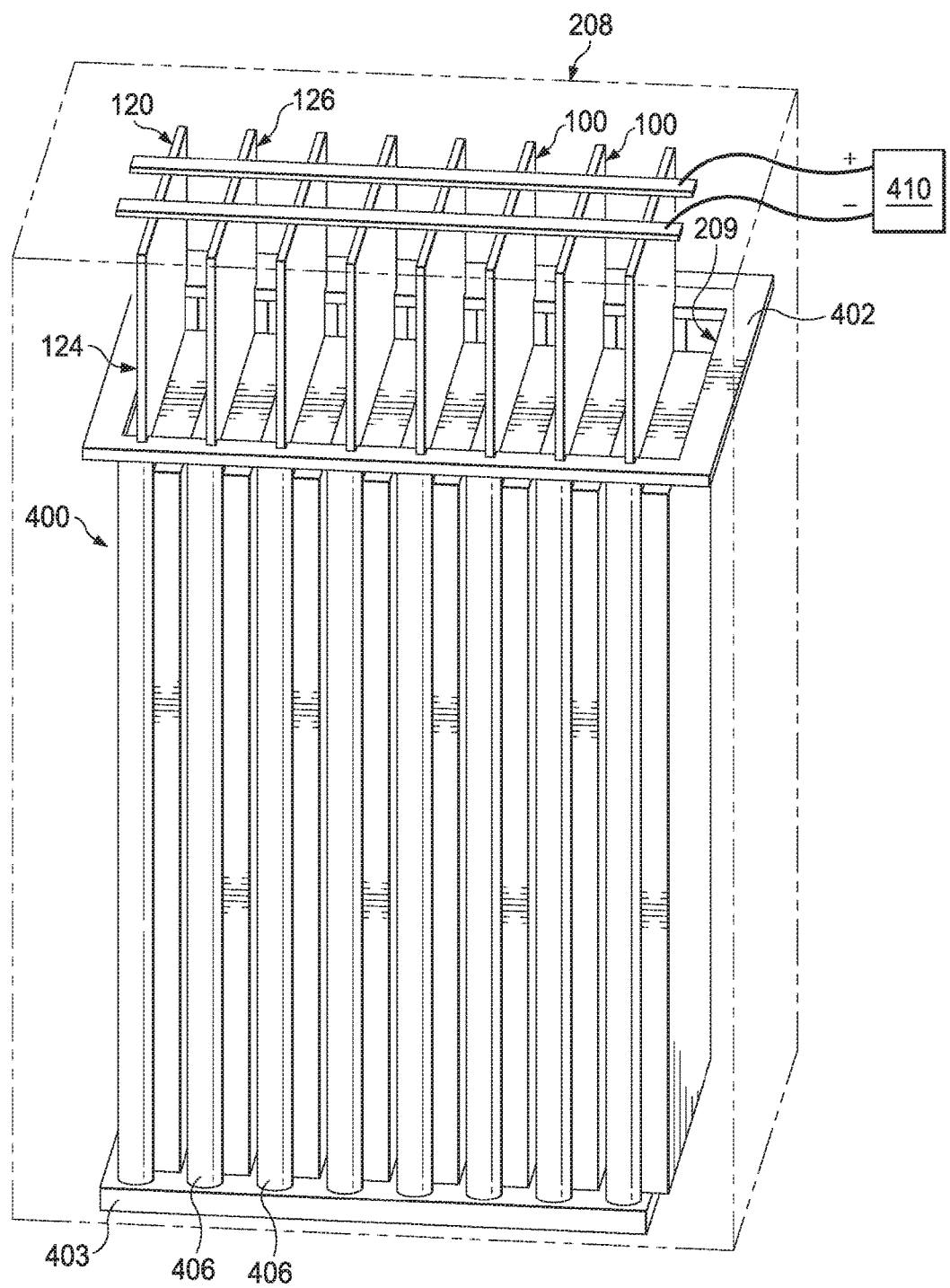
FIG. 4 is an illustration of a receiver structure in which the board of FIG. 1A is retrievably placed for stress testing in accordance with various examples.

FIG. 4 is an illustration of a receiver structure 400 in which the boards 100 of FIG. 1A are retrievably placed for stress testing. The receiver structure 400 can be a rack structure positionable in the tub 208, a molded/manufactured inner surface of the tub 208, a reconfigurable inner surface of the tub 208, etc.

The receiver structure 400 includes an upper frame 402 defining an aperture 209, a lower frame 403, and a plurality of slots 406, and high voltage source 410.

Each slot of the plurality of slots 406 is oriented orthogonally with respect to a plane of the aperture 209. As used, the term "orthogonally" may indicate a general ninety-degree orientation with the aperture 209 within an acceptable tolerance (i.e., +/−15-degrees). Also, as may be understood, the tolerance may be selected to accommodate other stress testing efficiencies, such as releasing a surface tension of a dielectric fluid in contact with the electronic components when the board is removed from the tub, increasing a surface area of the electronic components to a convection current within the tub as the dielectric fluid naturally cycles between relatively hotter and cooler temperatures as the heating element(s) 320 (FIG. 3) apply heat to the dielectric fluid, etc.

The high voltage source 410 provides a constant voltage source for stress testing of the board(s) 100. Conductive leads from the high voltage source 410 extend through the envelope and/or boundary of the tub 208 to engage conductive lead 102 and 104 (FIG. 1) of each of the board(s) 100. As an example of a safety switch, an interlock control can be coupled to an enclosure of the tub 208 (such as enclosure 207 of FIG. 2) such that the high voltage source 410 powers down, or does not provide power, if the enclosure door is moved to an opened position such as to allow partial or full access to the board(s) 100.

The plurality of slots 406 is adapted to receive a third end 124 and a fourth end 126 of the board(s) 100. In operation, the board(s) 100 are retrievably placed in the plurality of slots 406 for stress testing so that they can be subsequently retrieved from the receiver structure 400 of the stationary bath 200 in order to remove failing/failed electronic components. In this respect, heated dielectric fluid remains with the stationary bath 200, while the board(s) 100 can be processed apart from the stationary bath 200.

Dielectric fluid in the tub 208 also retains residual heat so that the predetermined temperature value can be obtained without starting the stress test with room temperature dielectric fluid, which is uniformly distributed when board(s) 100 are re-inserted into the tub 208 after removal of failed electronic components. In this manner, the stationary bath 200 (FIG. 2) provides for improved stress-test accuracy resulting in lower false-failures and greater electronic component stress-test throughput (on a foot-print per component basis).

Figure 5:
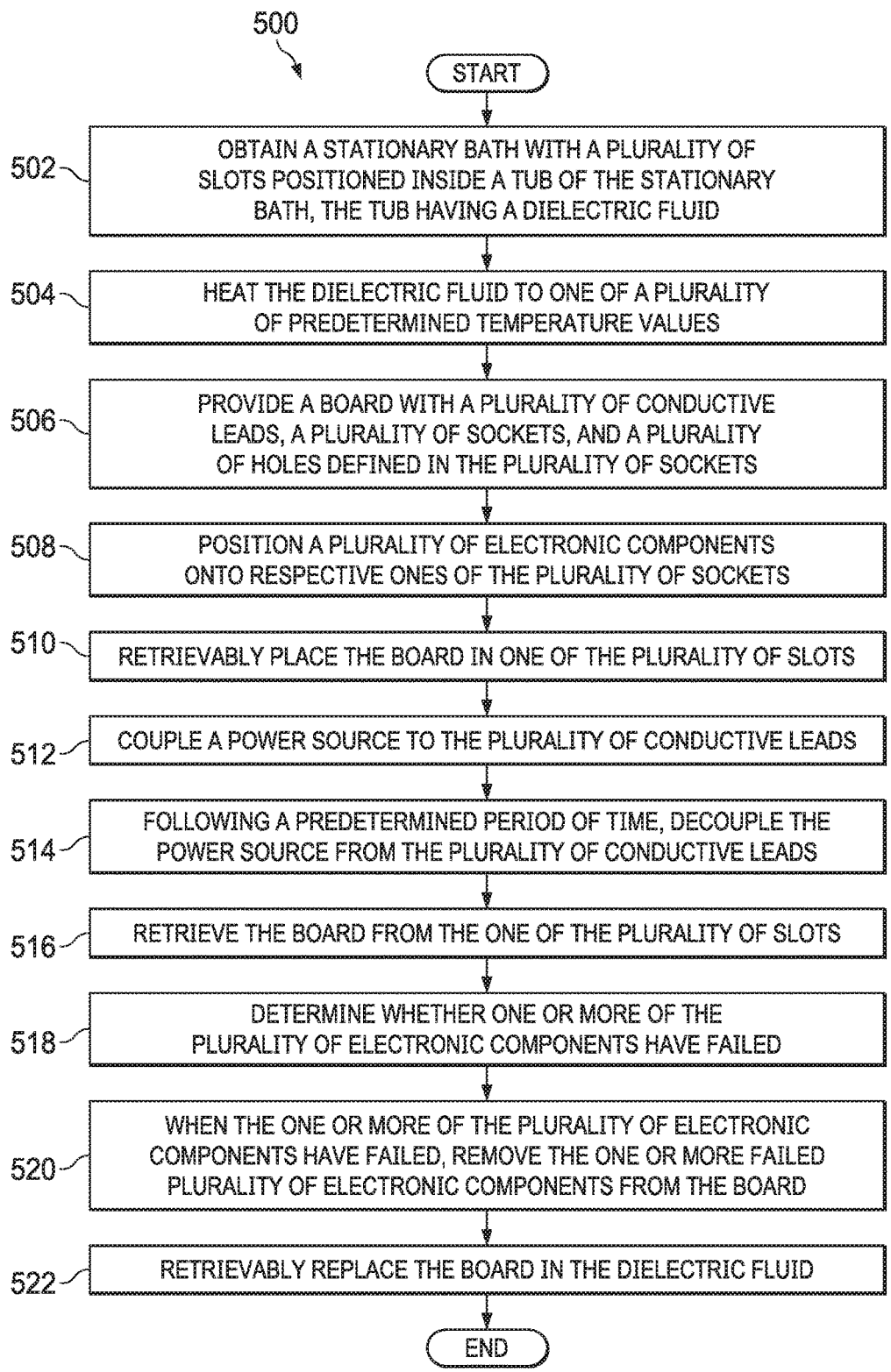
FIG. 5 illustrates a process for stress-testing electronic components in accordance with various examples.

FIG. 5 illustrates a process 500 for stress-testing electronic components. At operation 502, a stationary bath is obtained that defines a plurality of slots that are positioned inside a tub of the stationary bath, in which the tub has a dielectric fluid. At operation 504, the dielectric fluid is heated to one of a plurality of predetermined temperature values. In this respect, the process 500 may accommodate stress testing for a number of varying electronic components, from those calling for a lower predetermined temperature value (such as, for example, 25-degrees C.) to higher predetermined temperature values (such as, for example, 150-degrees C. and above). The stress testing may also be conducted for a predetermined time, at predetermined intervals, as is by way of example provided by industry standards and/or customer requirements. As a further example, the high power source can include predetermined voltage values, and further predetermined voltage values can relate to one or many electronic components undergoing stress testing.

At operation 506, a board with a plurality of conductive leads and a plurality of sockets is provided, in which at operation 508, a plurality of electronic components are positioned onto the plurality of sockets.

At operation 510, the board is retrievably placed in one of the plurality of slots, and at operation 512, a power source is coupled to the plurality of conductive leads. The plurality of conductive leads to which the power source is coupled is positioned at an end of the board that does not come into contact with the dielectric fluid, while the plurality of sockets do come into contact with the dielectric fluid.

Following a predetermined period of time, or until a predetermined number of electronic component failures occur, at operation 514 the power source is decoupled from the plurality of conductive leads, and at operation 516, the board is retrieved from the one of the plurality of slots. In this regard, the stationary bath with the dielectric fluid, heated to the one of a plurality of predetermined temperature values, is capable of being disengaged from the board such that dielectric fluid may retain residual heat, and the user is not required to coordinate the movement of the stationary bath to determine whether one or more of the plurality of electronic components has failed.

At operation 518, a determination is made as to whether one or more of the plurality of electronic components have failed. When, at operation 520, one or more of the plurality of electronic components have failed, the one or more plurality of electronic components are removed from the board. At operation 522, the board is retrievably replaced in the dielectric fluid with the remaining electrical components in place.

In this respect, the system and methods described herein promote faster failure isolation and improve testing safety of electronic components. Because the dielectric fluid is sustained at a predetermined temperature value, or at least a residual heat energy resides in the dielectric fluid of the stationary bath, additional stress testing for additional electronic components can resume at a quicker rate. The systems and methods described also realize improvements in testing accuracy because of lower false failures of the devices, in the stress testing turnover rate due to the larger number of electronic components that are placed on the board, and in the number of boards that can be received for testing at a time.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:
1. A system, comprising:
 a stationary bath including a tub that defines an aperture in a plane;
 a plurality of slots defined inside the tub and oriented orthogonally with respect to the plane;
 a dielectric fluid in the tub;
 a heating element to apply heat to the dielectric fluid; and
 a board retrievably placed in one of the plurality of slots, the board having a plurality of sockets operable to receive electronic components.

2. The system of claim 1, wherein the board further comprises a plurality of conductive leads on a first end of the board, wherein the first end is not in contact with the dielectric fluid in the tub when the board is retrievably placed in the one of the plurality of slots, and wherein second, third and fourth ends of the board are in contact with the dielectric fluid in the tub when the board is retrievably placed in the one of the plurality of slots.

3. The system of claim 2, wherein a first of the plurality of conductive leads is coupled to a voltage source and a second of the plurality of conductive leads is coupled to a ground.

4. The system of claim 2, wherein the plurality of sockets are arranged in at least a first socket column and a second socket column, the board further including a power supply rail positioned between the first socket column and the third end, between the second socket column and the fourth end, and between the first socket column and the second socket column.

5. The system of claim 4, wherein the first and second ends are parallel with respect to each other, and the third and fourth ends are parallel with respect to each other.

6. The system of claim 4 wherein the power supply rail couples to ground.

7. The system of claim 2 wherein the plurality of sockets are arranged in at least four columns on the board, and further including a power supply rail positioned between a first column and a second column and between a third column and a fourth column, wherein the power supply rail is not positioned between the second and third columns.

8. The system of claim 1, wherein each of the plurality of sockets defines a hole therethrough, and the board defines at least one trench therethrough, wherein the each of the plurality of sockets is positionable over the at least one trench.

9. The system of claim 1, wherein the heating element is to heat the dielectric fluid to a predetermined temperature value.

10. A method, comprising:
providing a stationary bath having a tub containing dielectric fluid;
heating the dielectric fluid;
providing a board having first and second parallel ends being shorter than third and fourth parallel ends;
coupling an electronic component to the board;
inserting the board into the dielectric fluid such that the first end is not in contact with the dielectric fluid and the second end is submerged in the dielectric fluid; and
coupling a power source to the electronic component via the first end of the board.

11. The method of claim 10, wherein inserting the board into the dielectric fluid comprises retrievably inserting the board into a slot formed in the tub, the slot extending orthogonally to a plane in which an opening of the tub lies.

12. The method of claim 10, further comprising removing the board from the dielectric fluid.

13. The method of claim 12, further comprising determining, after the board reaches room temperature, whether the electronic component failed.

14. The method of claim 13, wherein determining whether the electronic component failed comprises using an ohmmeter.

15. The method of claim 10 further comprising:
coupling another electronic component on the board; and
retrievably reinserting the board into the slot formed in the tub.

16. A method, comprising:
obtaining a stationary bath with a plurality of slots positioned inside a tub of the stationary bath, the tub having a dielectric fluid;
heating the dielectric fluid to one of a plurality of predetermined temperature values;
providing a board with a plurality of conductive leads and a plurality of sockets;
positioning a plurality of electronic components onto respective ones of the plurality of sockets;
retrievably placing the board in one of the plurality of slots;
coupling a power source to the plurality of conductive leads;
following a predetermined period of time, decoupling the power source from the plurality of conductive leads;
retrieving the board from the one of the plurality of slots;
determining whether one or more of the plurality of electronic components has failed;
when the one or more of the plurality of electronic components have failed, removing the one or more failed plurality of electronic components from the board; and
retrievably replacing the board into the dielectric fluid.

17. The method of claim 16, wherein the dielectric fluid comprises at least one of:
a vegetable-based oil;
a silicon-based oil; and
a synthetic-based oil.

18. The method of claim 16 wherein the plurality of sockets are arranged in multiple columns on the board, and wherein a power supply rail coupled to a first lead of the plurality of leads is positioned between a first socket column and a second socket column.

19. The method of claim 18, wherein another power supply rail coupled to a second lead of the plurality of conductive leads is positioned between the first socket column and a first end of the board and is also positioned between the second socket column and a second end of the board, the first and second ends being parallel to each other.

20. The method of claim 16 further comprising sliding the board into the one of the plurality of slots such that the plurality of conductive leads are not in contact with the dielectric fluid.

* * * * *